US006498056B1

United States Patent
Motsiff et al.

(10) Patent No.: US 6,498,056 B1
(45) Date of Patent: Dec. 24, 2002

(54) APPARATUS AND METHOD FOR ANTIFUSE WITH ELECTROSTATIC ASSIST

(75) Inventors: William T. Motsiff, Essex Junction, VT (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/702,406

(22) Filed: Oct. 31, 2000

(51) Int. Cl.⁷ ............................................... H01L 29/00
(52) U.S. Cl. ..................... 438/131; 257/529; 257/50; 257/530; 438/600; 438/467
(58) Field of Search ................... 257/530, 528, 257/529, 50; 438/131, 467, 600, 957, 660, 661, 662

(56) References Cited

U.S. PATENT DOCUMENTS

| 4,240,094 A | 12/1980 | Mader |
| 4,617,723 A | 10/1986 | Mukai |
| 4,751,197 A * | 6/1988 | Wills .................... 148/DIG. 55 |
| 5,270,251 A | 12/1993 | Cohen |
| 5,314,840 A | 5/1994 | Schepis et al. |
| 5,485,032 A | 1/1996 | Schepis et al. |
| 5,528,072 A | 6/1996 | Boudou et al. |
| 5,793,095 A | 8/1998 | Harvey |
| 5,811,869 A | 9/1998 | Seyyedy et al. |
| 5,915,171 A * | 6/1999 | Sheu .......................... 257/530 |
| 5,936,297 A * | 8/1999 | Jun ............................. 257/50 |

* cited by examiner

*Primary Examiner*—Steven Loke
*Assistant Examiner*—Donghee Kang
(74) *Attorney, Agent, or Firm*—RatnerPrestia; Lawrence R. Fraley, Esq.

(57) ABSTRACT

A structure and method for providing an antifuse which is closed by laser energy with an electrostatic assist. Two or more metal segments are formed over a semiconductor structure with an air gap or a porous dielectric between the metal segments. Pulsed laser energy is applied to one or more of the metal segments while a voltage potential is applied between the metal segments to create an electrostatic field. The pulsed laser energy softens the metal segment, and the electrostatic field causes the metal segments to move into contact with each other. The electrostatic field reduces the amount of laser energy which must be applied to the semiconductor structure to close the antifuse.

17 Claims, 11 Drawing Sheets

APPARATUS AND METHOD FOR ANTIFUSE WITH ELECTROSTATIC ASSIST

TECHNICAL FIELD

This invention relates generally to integrated circuits and more specifically to an apparatus and method for providing an antifuse.

BACKGROUND OF THE INVENTION

In integrated circuit manufacturing, it is often desirable to select particular circuits from an array. For example, a pair of redundant parallel circuits may be formed and, after testing one circuit to verify that it functions properly, the other parallel circuit may be removed. One method currently used to remove the unwanted circuit is to form programmable fuse elements (i.e., sacrificial metal lines buried in a dielectric layer) in the circuits which are normally closed, then to blow a fuse element by vaporizing the fuse element with laser energy to open the circuit that is not selected. This technique can cause rapid heating around the fuse, however, shattering the fuse cover and creating an explosive release of metal particles. This explosive release of metal particles can leave residue on the chip surface, creating the risk of contamination problems in subsequent process steps.

An alternative method is to form a normally open path, then to close the path to form an antifuse if the circuit is selected. One antifuse structure is disclosed in U.S. Pat. No. 5,793,095 issued to Harvey. Disclosed is the use of laser energy to fuse together two or more conductive terminals, through an optically transparent dielectric layer, to close a circuit (i.e., to form an antifuse). The disclosed antifuse structure requires that the conductive terminals to be fused must be located in the same metal layer. Therefore, it can not be used to form interlayer connections. In addition, the structure requires either a great deal of laser energy, which can cause damage, or that the terminals be very close, which can cause leakage current and capacitive coupling.

Another approach that incorporates antifuse structures is to apply laser or incoherent energy to damage a dielectric layer separating two conductive terminals. This approach uses a different closure mechanism than the present invention. In U.S. Pat. No. 5,811,869 issued to Seyyedy et al. and U.S. Pat. No. 5,528,072 issued to Boudou et al., laser energy is used to damage a dielectric layer to create a short between an upper conductor and a well or doped region of a substrate. Because these structure can only be formed in a substrate, they are not useful for interlevel connections and all levels above the substrate must be free of wiring above the antifuse. To create a short circuit, the terminals must be very close, which could cause leakage current and capacitive coupling absent the antifuse.

U.S. Pat. No. 5,270,251 issued to Cohen shows a method for providing a programmable link having a breakdown voltage (and consequently a programming voltage) that can be reduced by applying incoherent radiation to a composite insulator between metal layers in the link. Cohen teaches that specific limitations must be applied to the insulator formed between a bottom conductor and a top conductor, such as material and structural limitations. Cohen does not teach or suggest either a horizontal structure or laser energy. Also, Cohen forms a high-resistance link, which can adversely effect circuit performance.

U.S. Pat. Nos. 5,314,840 and 5,485,032, each issued to Schepis et al. and assigned to the assignee of the subject invention, teach a method and structure for forming a programmable antifuse comprising adjacent bodies of germanium and aluminum or aluminum alloy. The germanium is heated using resistance heating or irradiation, causing it to alloy with the aluminum and form a low-resistance connection. This method requires the use of germanium and aluminum. Also, the high energy input required to alloy the germanium and the aluminum may be detrimental to some circuits which require antifuses.

U.S. Pat. No. 4,617,723 issued to Mukai discloses a method for forming a conductive link comprising a metal layer and an undoped polysilicon insulating layer. The polysilicon is caused to react with the metal to form a conductive silicide link by applying heat with a laser beam. This process requires complex multi-poly processes and high activation temperatures.

The deficiencies of the conventional antifuse structures and of the conventional methods incorporating such structures show that a need still exists for improvement. To overcome the shortcomings of the conventional structures and methods, a new antifuse structure and a new method for closing or switching an antifuse structure are needed.

It is an object of the present invention to provide a low-resistance antifuse structure and method which do not cause contamination in subsequent processes. It is a further object of the present invention to provide a low-resistance antifuse structure and method with low-energy laser pulses and electrostatic assist which minimize energy input into the chip containing the antifuse. It is yet another object of the present invention to provide a low-resistance antifuse structure and method which are compatible with low dielectric constant (low-K) interlayer dielectrics.

SUMMARY OF THE INVENTION

To achieve these and other objects, and in view of its purposes, the present invention provides an antifuse structure and method using low-energy laser pulses and electrostatic assist to close the antifuse. In one embodiment of the present invention, two metal segments are formed having edges in close proximity. The metal segments can be embedded in material which is a poor diffusion barrier to the metal segments, such as polyimide or porous silicates for unclad copper. Alternatively, an air gap can be formed around the metal segments using a sacrificial fill technique. One or more of the metal segments is exposed to low-energy laser pulses which soften the metal segments, and a voltage potential is applied between the metal segments, causing the metal to flow and bridge the gap between the metal segments.

In another embodiment of the present invention, a first metal segment and a second metal segment are formed within an antifuse cavity filled with an interlayer dielectric, and the interlayer dielectric is removed using a process such as a wet etch. The second metal segment is exposed to low-energy laser pulses which soften the metal segment, while a voltage potential is applied between the first and second metal segments, causing the second metal segment to bend and to contact the first metal segment.

The present invention provides considerable improvement over the prior art. One advantage is that the present invention can provide a low-resistance antifuse which is closed with a minimum energy input into the chip containing the antifuse. Another advantage of the present invention is that it is compatible with new low-K dielectrics. Also, the present invention does not cause contamination in subsequent processing steps.

It should be understood that both the foregoing general description and the following detailed description are exemplary, but are not restrictive, of the invention.

BRIEF DESCRIPTION OF THE DRAWING

The features and advantages of an antifuse structure and method for creating an antifuse with electrostatic assist will be more clearly understood from the following description when read in connection with the accompanying drawing. Included in the drawing are the following figures:

FIGS. 1 through 3 show sequential top views of a structure and method for providing an antifuse with electrostatic assist according one embodiment of the present invention, in which

FIGS 4A through 8B show sequential views of a structure and method for providing an antifuse with electrostatic assist according to another embodiment of the present invention, in which

DETAILED DESCRIPTION OF THE INVENTION

The present invention will be described in detail with reference to the accompanying drawing in which like reference numerals designate similar or corresponding elements, regions, and portions. The present invention provides an antifuse structure and a method for switching the antifuse using an electrostatic assist, reducing the laser power required for switching.

First Embodiment

Figure 1:
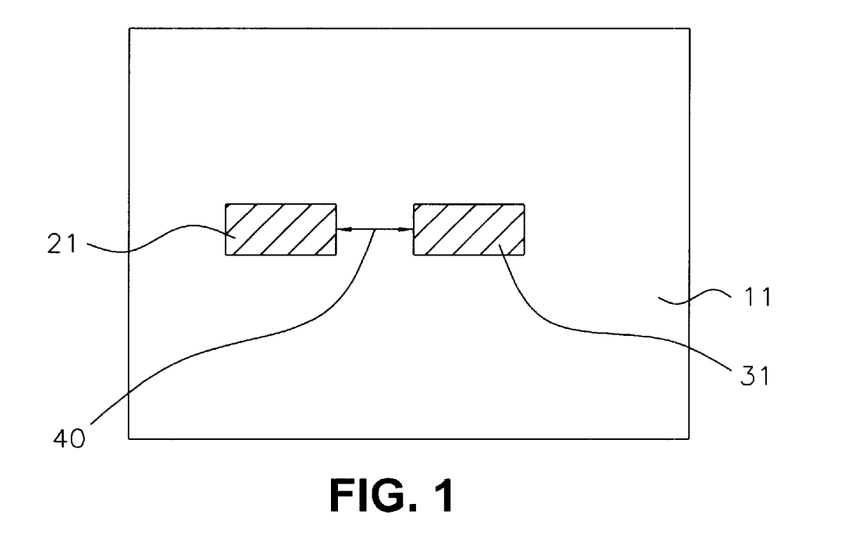
FIG. 1 illustrates two metal segments formed over a semiconductor structure with a fuse gap between the metal segments.

Referring now to FIG. 1, two metal segments (21, 31) are formed over a semiconductor structure (11) with a fuse gap (40) between metal segments (21, 31). Semiconductor structure (11) should be understood to possibly include a wafer or substrate of semiconducting material such as monocrystalline silicon or a like structure known in the art, such as silicon-on-insulator (SOI). Semiconductor structure (11) should be understood to possibly further include one or more conductive or insulating layers over a substrate or the like, as well as one or more active or passive components on or over a substrate or the like. Metal segments (21, 31) can be any of a number of conductive metals used in the art for interconnections, including but not limited to copper aluminum. The metal segments (21, 31) can be formed by a blanket deposition and patterning or by a damascene process, as is known in the art.

The fuse gap (40) can be an air gap, formed by depositing a sacrificial fill layer such as a polymer place holder and removing the sacrificial fill layer with, for example, an oxygen ($O_2$) reactive ion etch (RIE). Alternatively, fuse gap (40) can be filled with a dielectric material, which is a poor diffusion barrier to the metal in the metal segments (21, 31), such as polyimide or a porous silicate for unclad copper wiring. The width of the fuse gap (40) is preferably between about 0.25 microns and 0.50 microns, although a larger gap can be used with a higher voltage potential. Also, a smaller gap can be used provided the sacrificial fill layer can be removed and the current leakage remains within acceptable limits.

Figure 2:
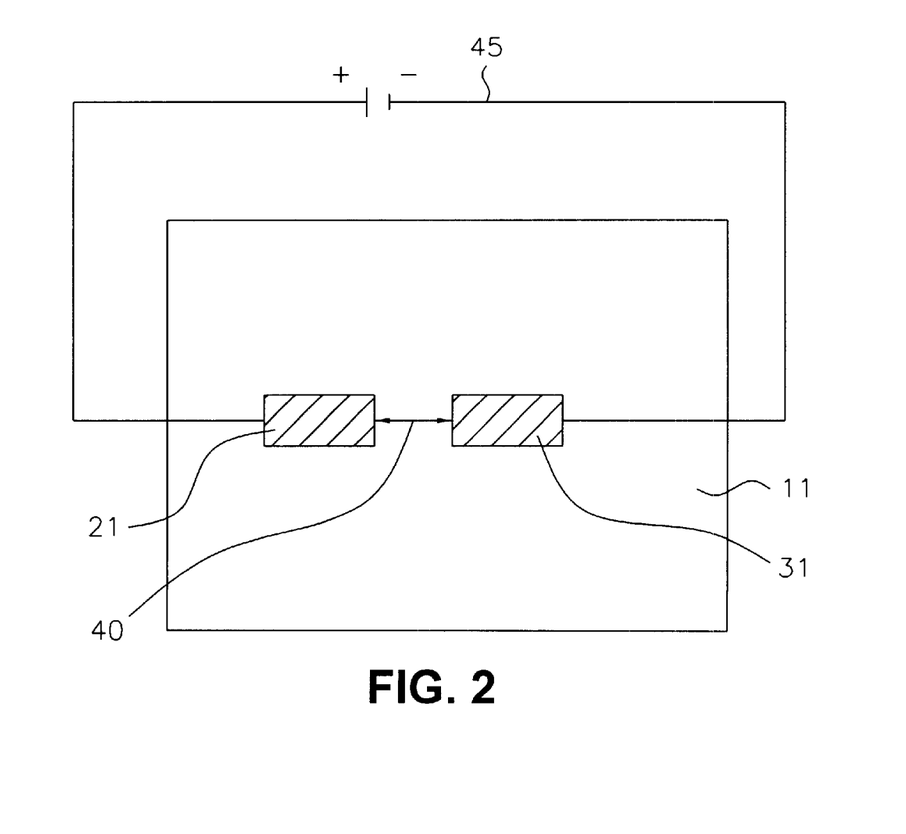
FIG. 2 illustrates a voltage potential applied between the metal segments.

Referring now to FIG. 2, a voltage potential (45) is applied between metal segments (21, 31), and one or both metal segments (21, 31) are heated with laser pulses to soften metal segments (21, 31). Voltage potential (45) must be sufficient to form a field which will cause mass motion. The voltage required for such a field varies inversely with the magnitude of laser energy applied to metal segments (21, 31) (i.e., the greater the laser energy applied to metal segments (21, 31), the lower the potential that is required to form a field which will cause mass motion and close the antifuse). For example, a potential of 1 volt across a gap of 0.25 microns will create an electric field of about 4 MV/m, which is sufficient to close the antifuse when a laser energy density of between about 0.1 Joule/$cm^2$ and 1.0 Joule/$cm^2$ is applied to metal segments (21, 31). This energy density can be provided by a laser power of between about $10^5$ Watts/$cm^2$ and $10^6$ Watts/$cm^2$ for pulses of between about 0.1 microseconds and 1 microsecond. This relatively low power laser, as compared to conventional laser-closed antifuses, avoids thermal gradients in metal segments (21, 31) that can cause stress and damage.

Because laser energy is dissipated quickly in metal wiring, single pulse energy is preferred. The pulse length of the laser energy can be adjusted between about 0.1 microseconds and 1 microsecond to provide the overall energy required. For aluminum-containing metal segments (21, 31), an ArF excimer laser is preferred, providing laser energy at a wavelength of about 193 nanometers because aluminum absorbs energy well at 193 nanometers. Other lasers can be used, however, with an adjustment to the energy recipe.

Figure 3:
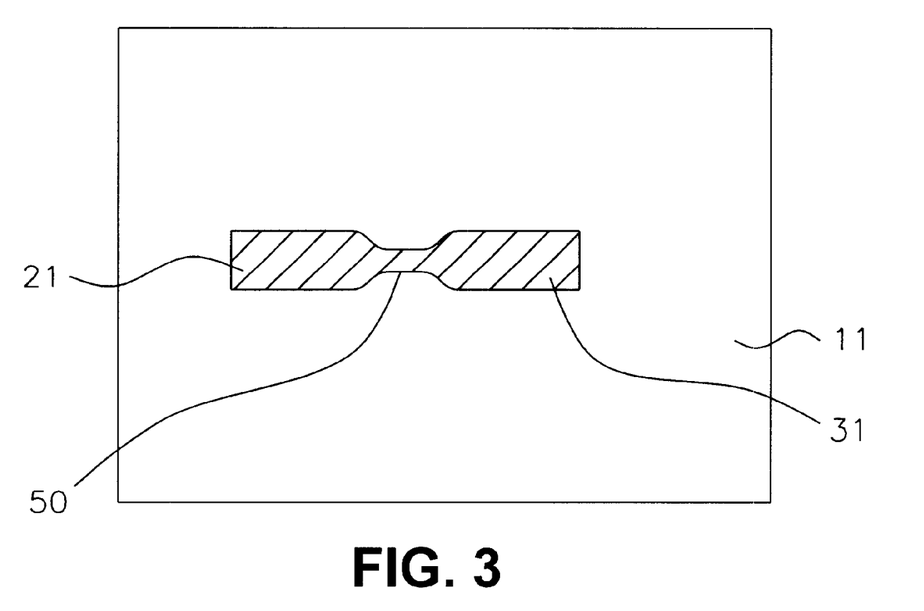
FIG. 3 illustrates how the electrostatic force between the metal segments, created by the applied voltage potential, causes the metal in the metal segments to flow when subjected to laser heating and bridge the fuse gap, creating a permanent conductive link.

Voltage potential (45) creates an electrostatic force between metal segments (21, 31). The force causes the metal in metal segments (21, 31), softened by laser energy, to flow and bridge fuse gap (40). Thus, a permanent conductive link (50) is created. Permanent conductive link (50) is shown in FIG. 3.

Optionally, one or both of metal segments (21, 31) can be formed with an irregular shape having one or more corners along the edge facing fuse gap (40). The irregular shape will enhance the electromagnetic field due to the potential gradient around each corner. Another option is to apply heat to the entire semiconductor structure, during antifuse closure, to reduce the amount of laser energy required. For example, the semiconductor structure can be heated to between about 100° C. and 200° C. for short periods of time to reduce the laser energy required without damaging most semiconductor structures.

Second Embodiment—Vertical Antifuse

Figure 4A:
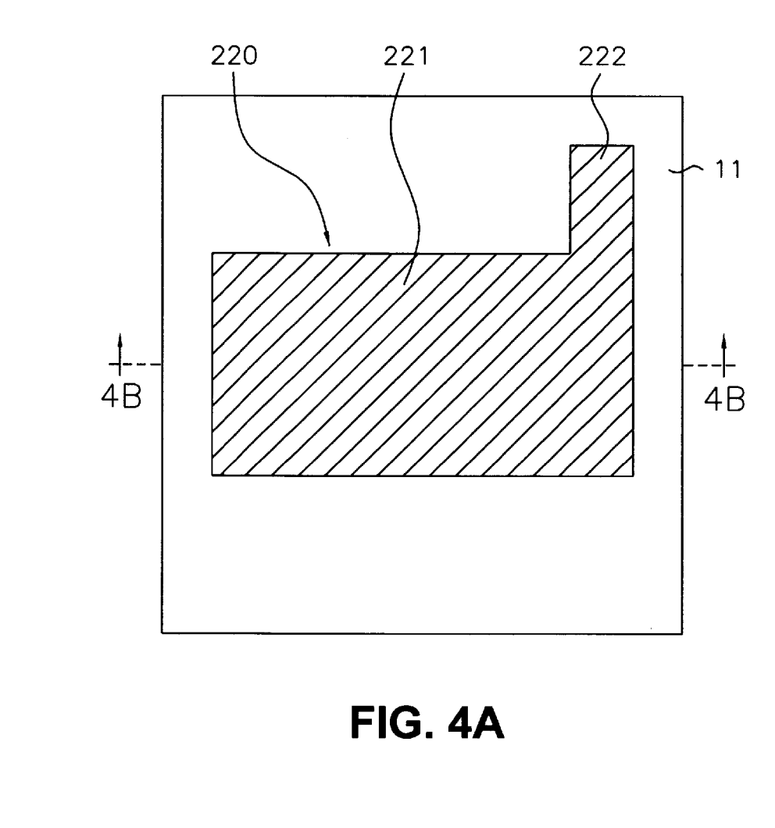
FIG. 4A illustrates a first metal layer, having a first metal segment with a lower terminal extension, formed over a semiconductor structure.
Figure 4B:
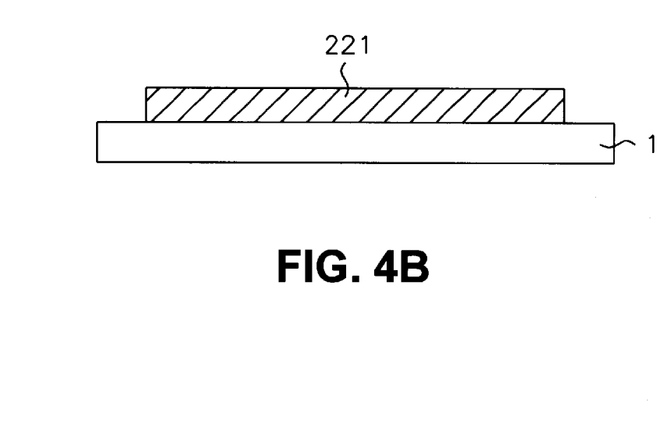
FIG. 4B is a sectional view taken along the line 4B—4B of FIG. 4A.

A second embodiment of the present invention is shown in FIGS. 4A through 8B. Referring to FIGS. 4A and 4B, a first metal layer (220) is formed over a semiconductor structure (11). First metal layer (220) can comprise any metal used for interconnect wiring in semiconductors, including but not limited to copper and aluminum. First metal layer (220) is patterned to form a first metal segment (221) with a lower terminal extension (222) extending from first metal segment (221).

Figure 5A:
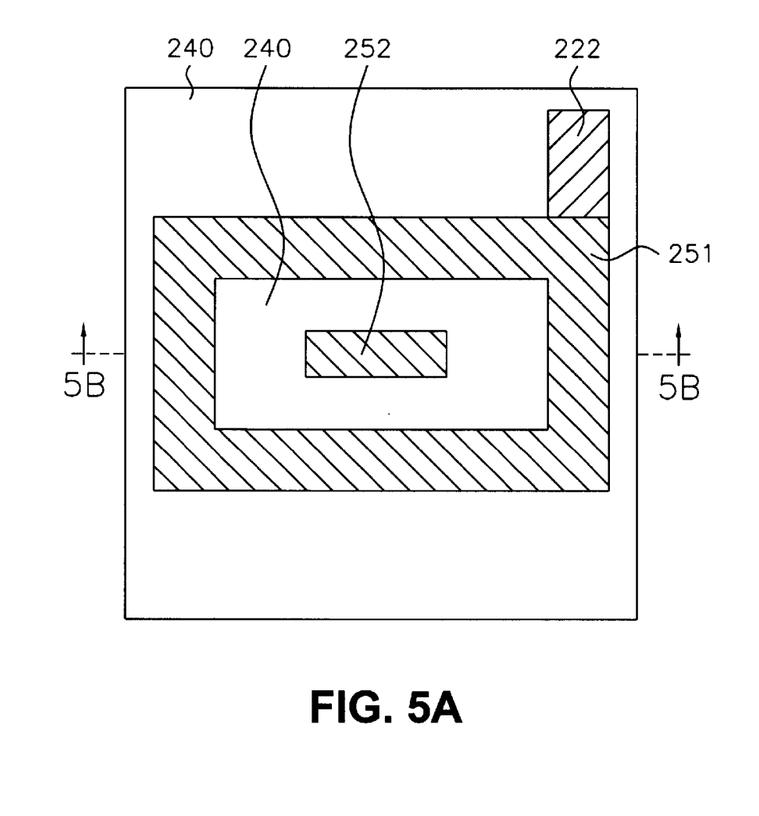
FIG. 5A illustrates an interlayer dielectric, in which cavity sidewalls and a second metal segment are formed, placed over the first metal segment.
Figure 5B:
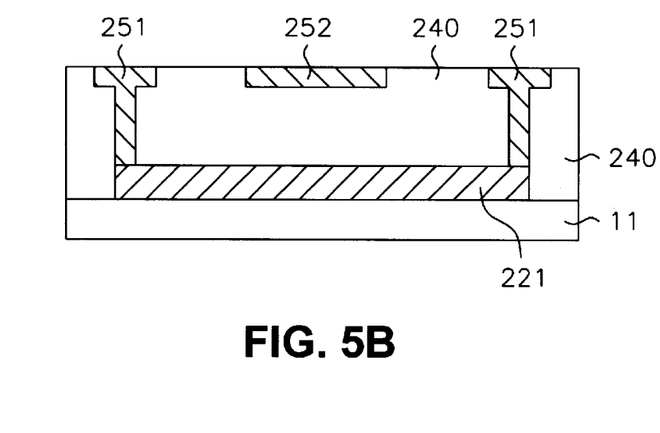
FIG. 5B is a sectional view taken along the line 5B—5B of FIG. 5A.

Referring to FIGS. 5A and 5B, an interlayer dielectric (240) is formed over first metal segment (221). Interlayer dielectric (240) preferably comprises silicon oxide as is known in the art, but may comprise an organic dielectric such as polyimide, polyazylene, polyarylene ether, or other dielectric materials as are known in the art. Next, interlayer dielectric (240) is patterned to form cavity sidewall openings that contact first metal segment (221) and extend upward to the top of interlayer dielectric (240). The cavity sidewall openings are filled with a metal plug (i.e., a via) to form cavity sidewalls (251). Sidewalls (251) of the antifuse structure are continued upward by patterning the next wiring level(s) to form the metal sections. Optionally, the bottom of the cavity can be an etch-resistant dielectric in which case lower terminal extension (222) is connected elsewhere on the cavity sidewall.

A second metal segment (252) is formed in interlayer dielectric (240) within, but not contacting, the cavity sidewalls (251) or first metal segment (221). Second metal segment (252), which is preferably formed using a damascene process, is circumscribed by interlayer dielectric (240) and cavity sidewalls (251). Second metal segment (252) preferably has a length of less than about 10 microns, and is approximately equidistant from sidewalls (251) along its length and about 1 micron from first metal segment (221). Although these geometries are compatible with the voltage potential and the laser energy recipe supplied in the first embodiment, it should be understood that other geometries and recipes are within the scope of the present invention.

Figure 6A:
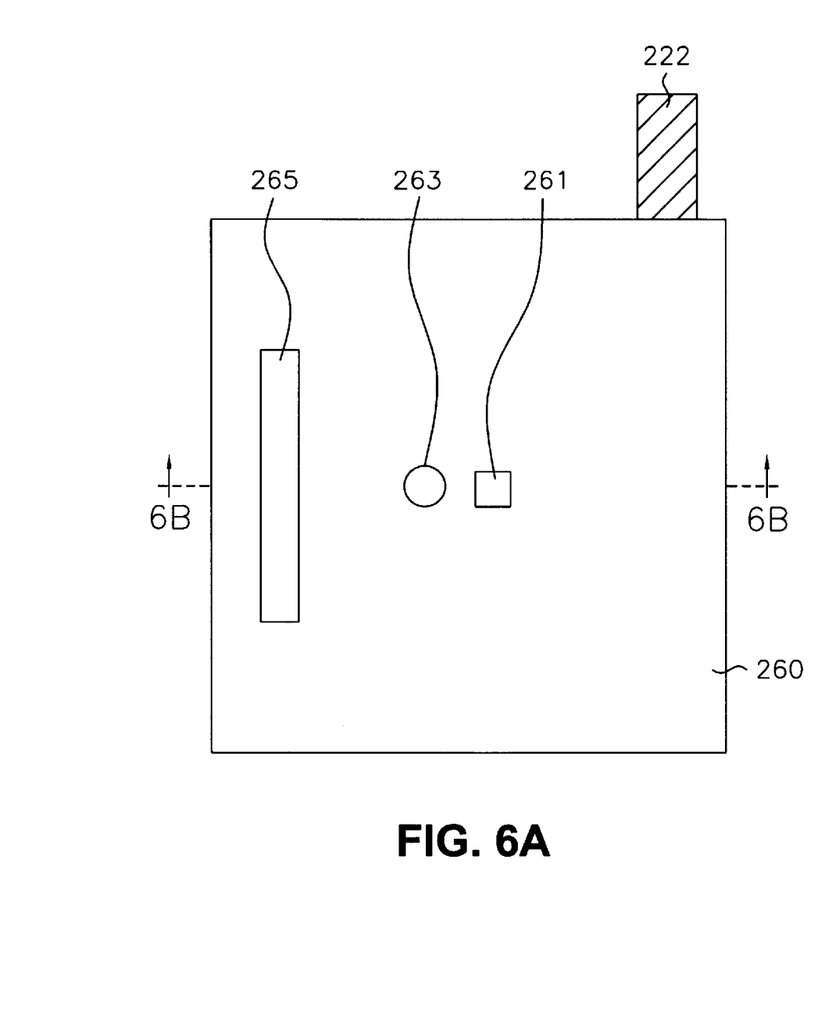
FIG. 6A illustrates an antifuse cover formed over the interlayer dielectric, the cavity sidewalls, and the second metal segment and patterned to form an upper contact opening, a laser window opening, and an etchant opening.
Figure 6B:
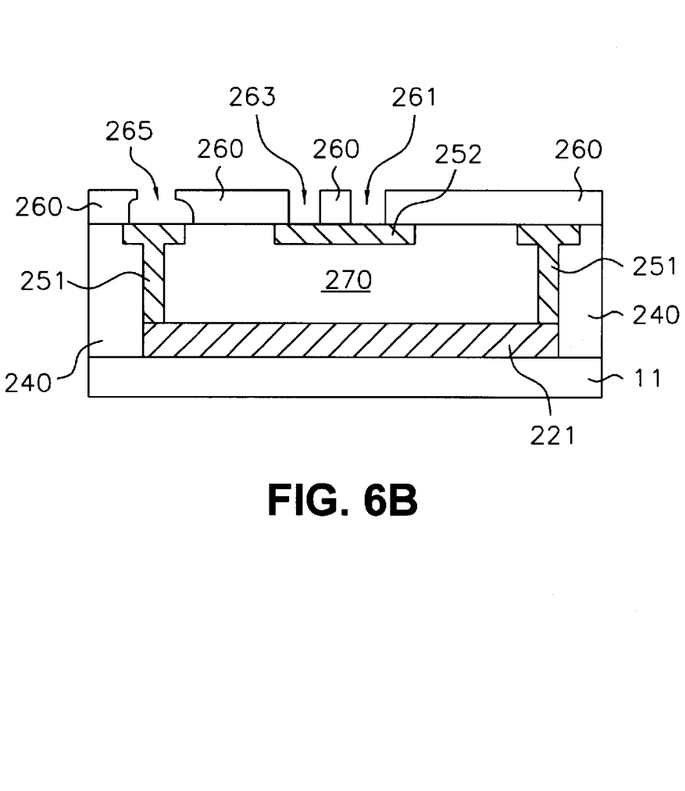
FIG. 6B is a sectional view taken along the line 6B—6B of FIG. 6A.

Referring to FIGS. 6A and 6B, an antifuse cover (260) is formed over interlayer dielectric (240), cavity sidewalls (251), and second metal segment (252). Antifuse cover (260) preferably comprises silicon nitride formed in two layers. Antifuse cover (260) is patterned to form an upper contact opening (261), a laser window opening (263), and an etchant opening (265). Interlayer dielectric (240) within cavity sidewalls (251) is removed through etchant opening (265) using a wet etch selective to interlayer dielectric (240) over the material of cavity sidewalls (251), second metal segment (252), and antifuse cover (260). Such removal forms an antifuse cavity (270). When dielectric layer (240) comprises an organic dielectric, removal may be accomplished using an oxygen-containing plasma or reactive ion etch.

Figure 7A:
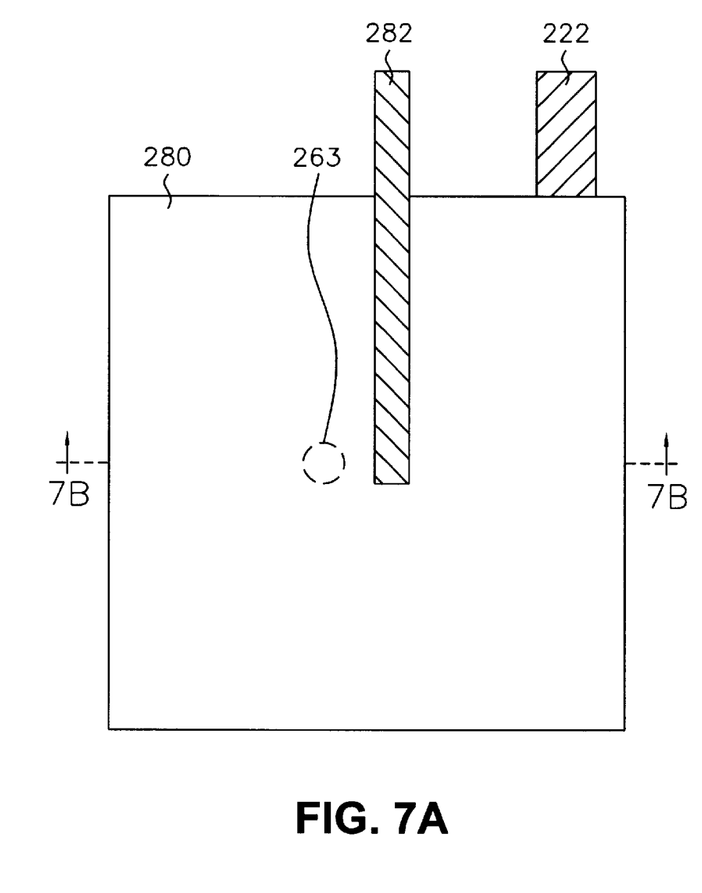
FIG. 7A illustrates an antifuse cavity, formed by removing the interlayer dielectric through the etchant opening by etching, and an interlayer dielectric, deposited over the structure, in which an upper contact is formed contacting the second metal segment.
Figure 7B:
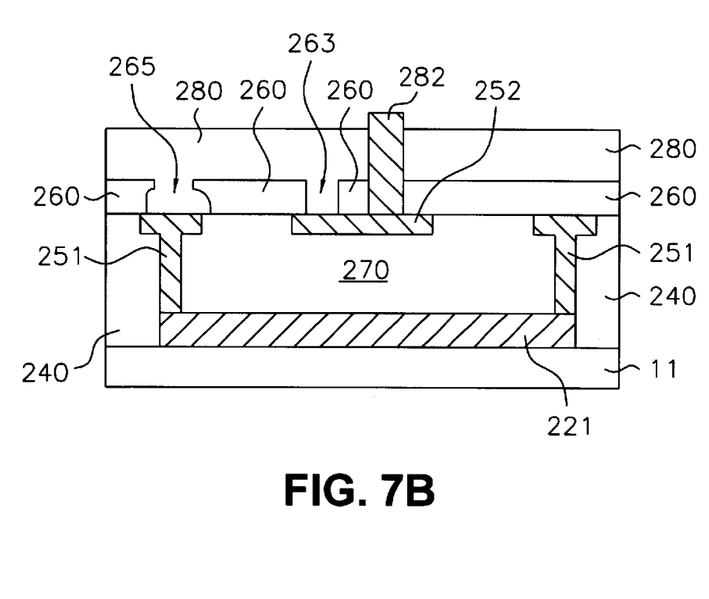
FIG. 7B is a sectional view taken along the line 7B—7B of FIG. 7A.

Referring to FIGS. 7A and 7B, an interlayer dielectric (280) is deposited over the semiconductor structure. Etchant opening (265) has a narrow neck to minimize the flow of a subsequently formed second interlayer dielectric into antifuse cavity (270), sealing antifuse cavity (270) under interlayer dielectric deposition pressure. A method for forming etchant opening (265) is provided in "Vacuum-sealed Silicon Micromachines Incandescent Light Source," C. H. Masrangelo and R. S. Muller, IEDM proceedings, p. 503 (1989), which is incorporated by reference. Interlayer dielectric (280) can be formed such that laser energy can be transmitted through it as disclosed in the publication by Masrangelo and Muller, foregoing the need for an explicit laser window opening. In this way, antifuse cavity (270) is hermetically sealed during fabrication, and does not require more processing after the fuse blow. An upper contact (282) is formed in interlayer dielectric (280) contacting second metal segment (252).

Figure 8A:
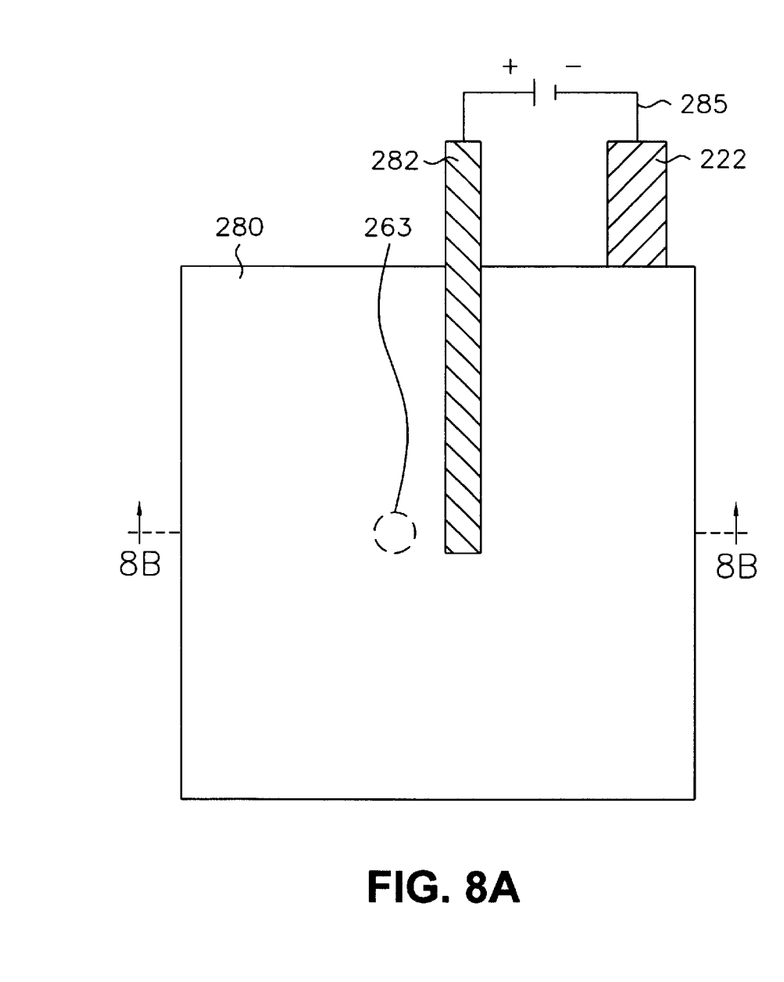
FIG. 8A illustrates a voltage potential applied between the first metal segment, through the lower terminal extension, and the second metal segment, through the upper contact during application of pulsed laser energy to the second metal segment through the laser window opening.
Figure 8B:
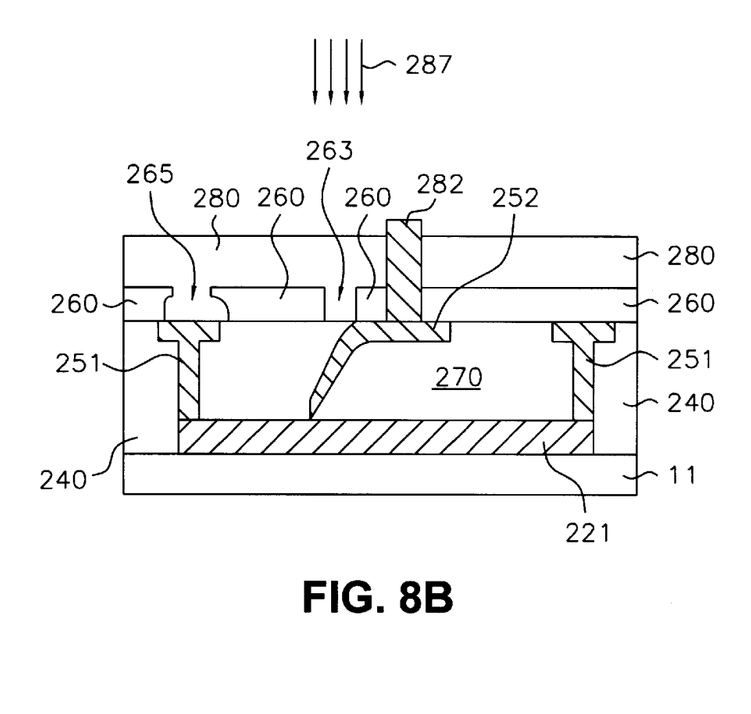
FIG. 8B is a sectional view taken along the line 8B—8B of FIG. 8A.

Referring to FIGS. 8A and 8B, a voltage potential (285) is applied between first metal segment (221), through lower terminal extension (222), and second metal segment (252), through upper contact (282). Voltage potential (285) forms an electrostatic field between first metal segment (221) and second metal segment (252). With voltage potential (285) applied, pulsed laser energy (287) is applied to second metal segment (252) through laser window opening (263) to soften second metal segment (252). The electrostatic field causes softened second metal segment (252) to move into contact with first metal segment (221), closing the antifuse. The voltage required varies inversely with the magnitude of laser energy applied to second metal segment (221). The preferred voltage potential and laser energy recipe is approximately 1 Volt and between about 0.1 Joule/cm$^2$ and 1.0 Joule/cm$^2$, although it should be understood that other voltage potential and laser energy recipes can be derived that are within the scope of the present invention.

FIG. 8B shows the end of second metal segment (252) moving into contact with first metal segment (221). It should be understood that, due to adhesion of second metal segment (252) to antifuse cover (260), the middle of second metal segment (252), rather than the end, could move into contact with first metal segment (221). The length of second metal segment (252) must be sufficient to allow contact to first metal segment (221) if adhesion occurs.

Figure 7C:
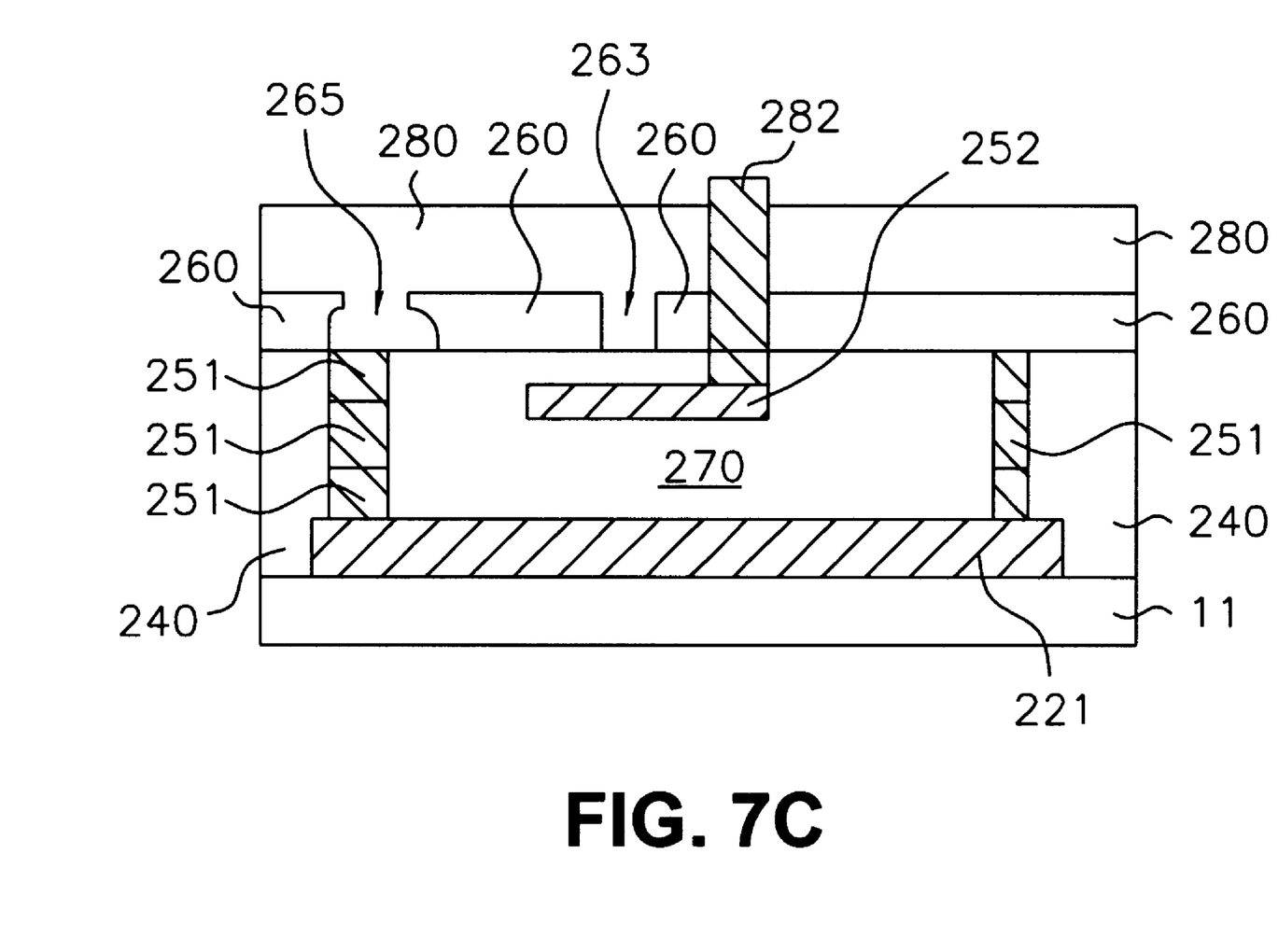
FIG. 7C is a sectional view illustrating an optional embodiment with the antifuse cavity extending above the second metal segment.

Referring to FIG. 7C, an optional second dielectric layer (not shown) may be formed over second metal segment (252) and cavity sidewalls (251) can be extended upward through the second dielectric layer before forming antifuse cover (260). Both the dielectric layer and the second dielectric layer are removed using an etch, resulting in antifuse cavity (270) extending above second metal segment (252). A key advantage of antifuse cavity (270) extending above second metal segment (252) is a reduced risk that second metal segment (252) will adhere to antifuse cover (260). Adhesion could adversely effect antifuse closure.

Second Embodiment—Horizontal Antifuse

Figure 9:
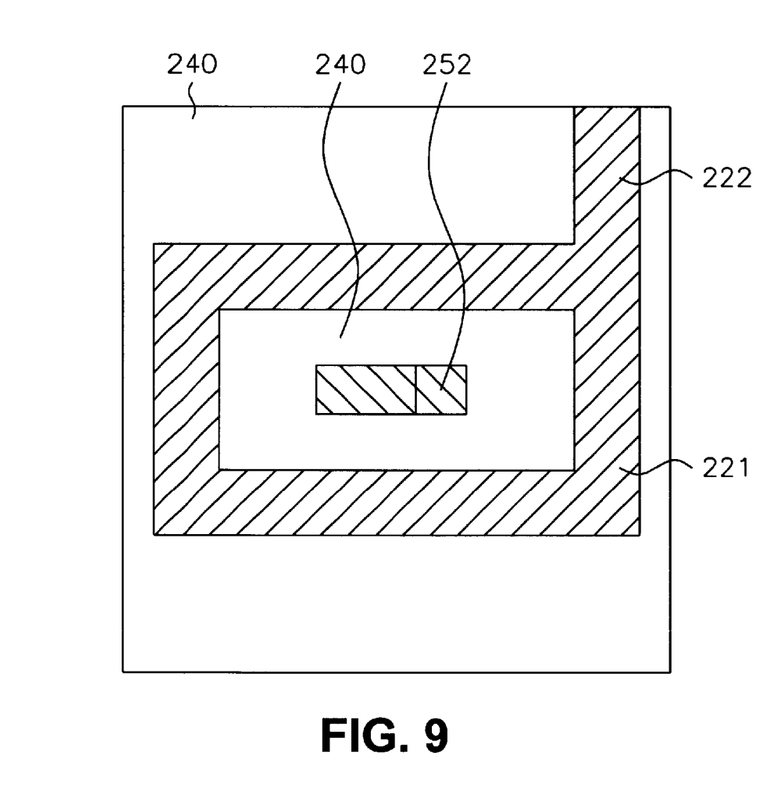
FIG. 9 illustrates a top view of a horizontal embodiment of the present invention before closing the antifuse with the antifuse cover omitted for clarity.
Figure 10:
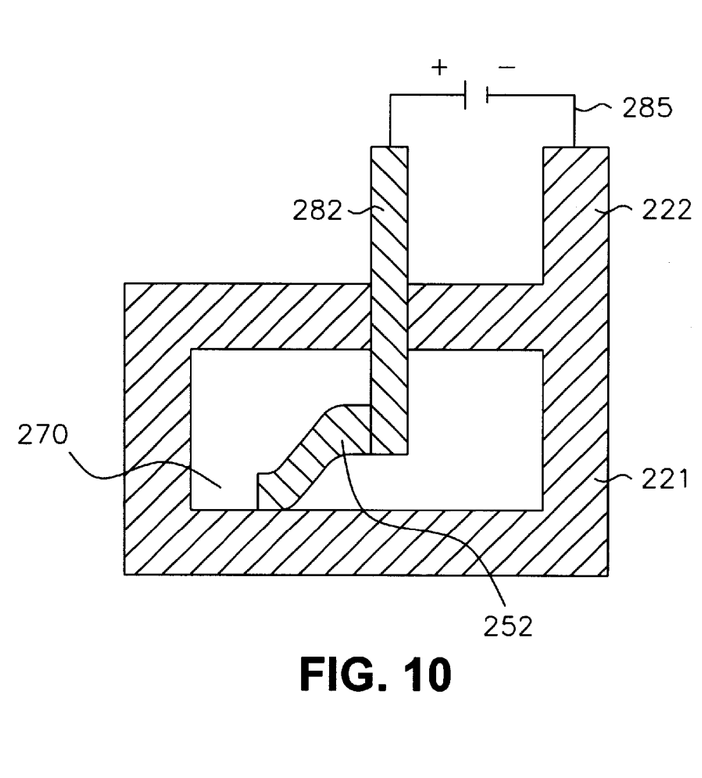
FIG. 10 illustrates a top view of a horizontal embodiment of the present invention after closing the antifuse with the antifuse cover omitted for clarity.

As shown in FIGS. 9 and 10, the antifuse can alternatively be formed horizontally, so that first metal segment (221) and second metal segment (252) are formed from the same metal layer. In the horizontal antifuse, first metal segment (221) is formed in at least one of the sidewall openings. Second metal segment (252) may be formed much closer to one sidewall than to the other if the cavity sidewalls are to be electrically connected. Also, in the horizontal antifuse, the bottom of the cavity may comprise a dielectric, such as silicon nitride, rather than a first metal layer.

Referring now to FIG. 9, dielectric layer (240) overlying the semiconductor structure (not shown) is patterned to form sidewall openings and a second metal segment opening. The sidewall openings have a first terminal extension opening. The sidewall openings, first terminal extension opening, and second metal segment opening are filled with a metal, such as by deposition and CMP planarization to form first metal segment (221) which is also the sidewalls of the antifuse cavity, a first terminal extension (222), and a second metal segment (252). Optionally, the cavity sidewalls are extended above and below second metal segment (252) using additional metal segments (e.g., via and wiring metal).

Referring now to FIG. 10, a antifuse cover is formed over the antifuse cavity and patterned to form an upper contact opening, a laser window opening, and an etchant opening as described for the vertical antifuse of the second embodiment. The interlayer dielectric within the cavity sidewalls is removed through the etchant opening in the antifuse cover with a wet etch selective to the interlayer dielectric over the first metal segment, the cavity sidewalls, the second metal segment, and the antifuse cover as described in the vertical antifuse of the second embodiment. An interlayer dielectric (not shown) and an upper contact (282) are also formed as described for the vertical antifuse of the second embodiment. Upper contact (282) can be made from the bottom if the bottom of the cavity is an etch-resistant dielectric such as silicon nitride.

As shown in FIG. 10, a voltage potential (285) is applied between first metal segment (221), through lower terminal extension (222), and second metal segment (252), through upper contact (282). Voltage potential (285) forms an electrostatic field, and pulsed laser energy is applied to second metal segment (252) through the laser window opening to soften the second metal segment (252). The combination of the electrostatic field and the laser energy causes second metal segment (252) to soften and move into contact with first metal segment (221).

In the horizontal antifuse, second metal segment (252) preferably has a length of less than about 10 microns. The gap between second metal segment (252) and first metal segment (221) at one sidewall is preferably about 1 micron, while the gap between second metal segment (252) and first metal segment (221) at the opposite sidewall is at least 1 micron greater. For this geometry, the voltage potential and laser energy recipe of the first embodiment can be used, although it should be understood that different geometries can be used by modifying the voltage potential and laser energy recipes.

Second Embodiment—Multi-State Antifuse

Either the vertical antifuse of the second embodiment or the horizontal antifuse of the second embodiment can be fabricated as a multi-state antifuse. A third metal segment is formed, whereby the antifuse can be closed to a first circuit connected to the first metal segment by applying a voltage potential between the first metal segment and the second metal segment, or the antifuse can be closed to a second circuit connected to the third metal segment by applying a voltage potential between the third metal segment and the second metal segment. Additional metal segments beyond the third metal segment can similarly be added to close additional circuits. The horizontal multistate antifuse is illustrated in FIGS. 11 and 12.

Figure 11:
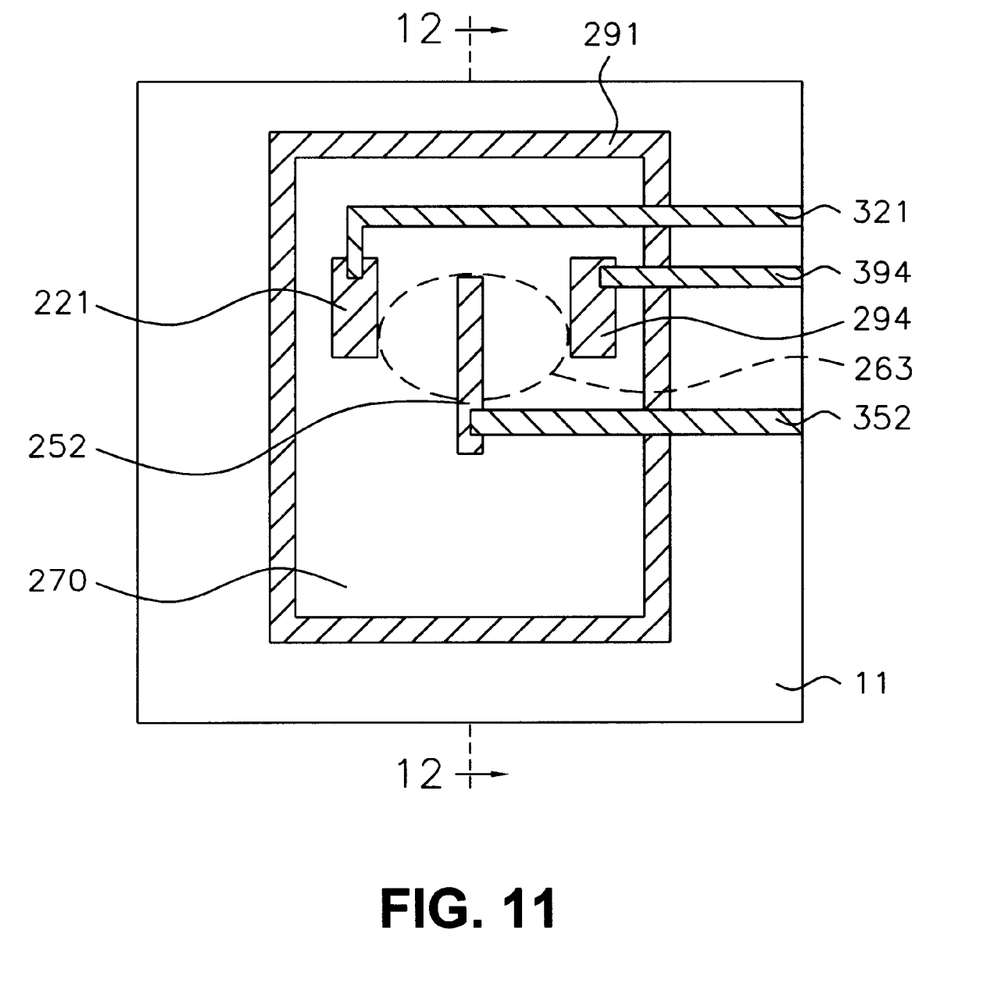
FIG. 11 is a top view of a multi-state antifuse structure according to yet another embodiment of the present invention with the antifuse cover omitted for clarity.
Figure 12:
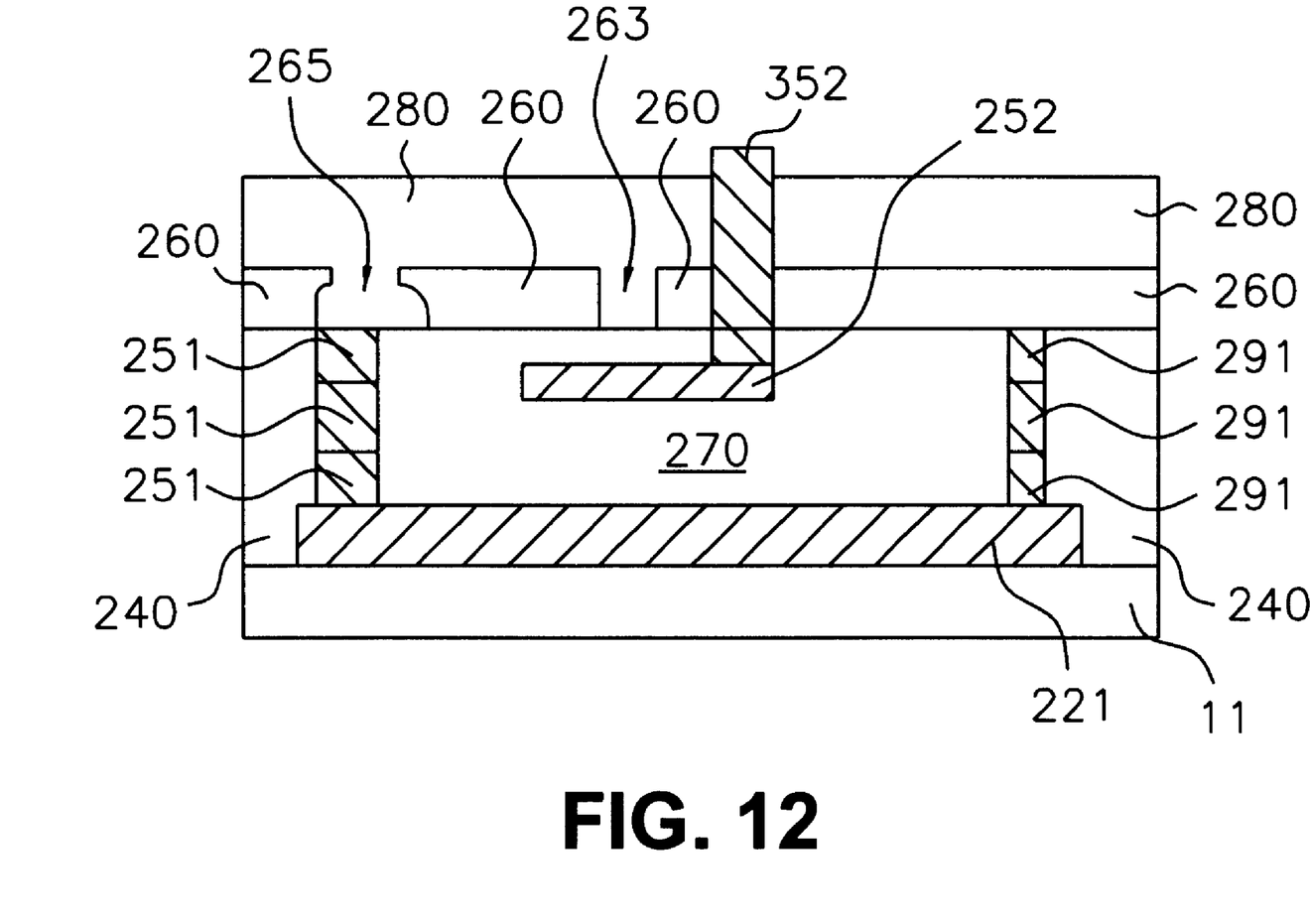
FIG. 12 is a cross-sectional view of the antifuse structure of FIG. 11 taken along line 12—12.

Referring now to FIGS. 11 and 12, a bottom layer (not shown) for an antifuse cavity (270) is deposited on a semiconductor structure (11). A cavity dielectric (not shown) is formed over the bottom layer. The dielectric layer is patterned and filled with at least one material with etch selectivity to the dielectric layer, forming cavity sidewalls (291), a first metal segment (221), a second metal segment (252), and a third metal segment (294). The cavity dielectric can be formed in multiple layers with the cavity sidewalls (291) formed in each layer and the metal segments (221, 252, 294) can be formed in a middle layer using damascene process steps for each layer. The cavity sidewalls (291) and the metal segments (221, 252, 294) preferably comprise the same metal. Optionally, cavity sidewalls (291) are extended above and below the metal segments (221, 252, 294) using additional metal segments (e.g., via and wiring metal). In addition, as in all aspects of the second embodiment, the first cavity sidewalls can comprise dielectric material with etch selectivity to the dielectric layer. The metal segments (221, 252, 294) are isolated from the bottom layer and the cavity sidewalls by the cavity dielectric.

An antifuse cover (260) is formed over the multi-state fuse cavity as described for the horizontal antifuse of the second embodiment, forming a cavity (270). The antifuse cover is patterned to form an etchant opening (265). The antifuse cover is formed such that laser energy can be transmitted through it. The cavity dielectric is removed from the cavity (270) through the etchant opening (265).

An interlayer dielectric layer (280) is formed over the cavity sidewalls (291) and patterned to form wiring (321, 352, 394) to the metal segments (221, 252, 294). The wiring (321, 352, 394) and vias to connect the wiring to the metal segments (221, 252, 294) may be formed using a damascene process as is known in the art. Contacts to the metal segments (221, 252, 294) can be made from the bottom if the bottom of the cavity is an etch-resistant dielectric such as silicon nitride.

The three-state antifuse can be used to close either of two circuits. A circuit connected to the third metal segment (294) (i.e., terminal 1) can be closed by applying a voltage potential between the second metal segment (252) and the third metal segment (294) while applying laser power to the second metal segment (252) through a fuse window (263). A circuit connected to the first metal segment (291) (i.e., terminal 3) can be closed by applying a voltage potential between the second metal segment (252) and the first metal segment (291) while applying laser power to the second metal segment (252) through the fuse window (263).

What is claimed is:

1. A method for switching an antifuse, comprising the steps of:

(a) providing two metal segments with a fuse gap between the metal segments;

(b) heating one or more of the metal segments with laser pulses, softening the metal segments; and (c) applying a voltage potential between the metal segments, causing the metal in the metal segments to flow and bridge the fuse gap.

2. The method of claim 1 wherein the laser pulses have an energy density of less than 1 Joule/cm$^2$.

3. The method of claim 1 wherein the fuse gap is an air gap created by forming a sacrificial fill layer which is subsequently removed using an etch.

4. The method of claim 3 wherein the sacrificial fill layer comprises a polymer place holder formed between the metal segments and subsequently removed using a reactive ion etch.

5. The method of claim 1 wherein the fuse gap is filled with a poor diffusion barrier to the metal in the metal segments.

6. The method of claim 1 wherein at least one of the metal segments has an irregular shape with one or more corners along the edge facing the fuse gap, enhancing the electric field due to the potential gradient around each corner.

7. A method for forming an antifuse, comprising the steps of:
   (a) forming a first metal segment with a lower terminal extension over a semiconductor structure;
   (b) forming an interlayer dielectric over the first metal segment, patterning the interlayer dielectric to form cavity sidewall openings that contact the first metal segment and extend upward to the top of the interlayer dielectric, forming metal cavity sidewalls in the cavity sidewall openings to form a cavity surrounded on the bottom by the first metal segment and on the sides by the cavity sidewalls and filled with the interlayer dielectric, and repeating this step to extend the height of the cavity sidewalls as necessary;
   (c) forming a second metal segment that is circumscribed by the interlayer dielectric and by the cavity sidewalls;
   (d) forming a antifuse cover over the interlayer dielectric, the cavity sidewalls, and the second metal segment having an upper contact opening, a laser window opening, and a etchant opening;
   (e) removing the interlayer dielectric in the cavity through the etchant opening in the antifuse cover with a wet etch selective to the interlayer dielectric over the first metal segment, the cavity sidewalls, the second metal segment, and the antifuse cover; and
   (f) applying pulsed laser energy to the second metal segment through the laser window opening to soften the second metal segment while applying a voltage potential between the first metal segment and the second metal segment forming an electrostatic field between the first metal segment and the second metal segment, causing the softened second metal segment to move into contact with the first metal segment.

8. The method of claim 7 wherein a sealing layer is deposited over the etchant hole after removing the interlayer dielectric from the cavity.

9. The method of claim 7 further comprising, before applying pulsed laser energy to the second metal segment and applying a voltage potential between the first metal segment and the second metal segment, the steps of:
   forming a second interlayer dielectric over the antifuse cover, and forming an upper contact opening in the second interlayer dielectric over the upper contact opening in the antifuse cover; and
   forming an upper contact in the upper contact opening.

10. The method of claim 7 further comprising contacting the second metal segment using a via through the cavity bottom and providing a non etch-specific dielectric as the cavity bottom.

11. The method of claim 7 wherein the second metal segment has a length of less than 10 microns, the pulsed laser energy density is less than 1 Joule/cm$^2$, the voltage potential is less than 1 volt, and the metal segments comprise one of aluminum or copper.

12. The method of claim 9 wherein the metal segments comprise aluminum.

13. The method of claim 9 further comprising a third metal segment formed adjacent the second metal segment and electrically isolated from the first metal segment and the second metal segment; whereby the antifuse can be closed to a first circuit connected to the first metal segment by applying a voltage potential between the first metal segment and the second metal segment, or the antifuse can be closed to a second circuit connected to the third metal segment by applying a voltage potential between the third metal segment and the second metal segment.

14. A method for forming a horizontal antifuse, comprising the steps of:
   (a) forming a first metal segment with a first terminal extension and a second metal segment in a dielectric layer on a semiconductor structure;
   (b) forming cavity sidewalls in the dielectric layer around the first metal segment and the second metal segment;
   (c) forming an antifuse cover over the dielectric layer, the cavity sidewalls, and the second metal segment, the antifuse cover having an upper contact opening, a laser window opening, and a etchant opening;
   (d) removing the dielectric layer within the cavity sidewalls through the etchant opening in the antifuse cover with an etch selective to the dielectric layer over the first metal segment, the cavity sidewalls, the second metal segment, and the antifuse cover;
   (e) forming an upper contact in the upper contact opening or optionally forming a contact through an etch-resistant dielectric cavity bottom layer if present; and
   (f) applying pulsed laser energy to the second metal segment through the laser window opening to soften the second metal segment while applying a voltage potential between the first metal segment and the second metal segment to form an electrostatic attraction between the first metal segment and the second metal segment and cause the softened second metal segment to move into contact with the first metal segment.

15. The method of claim 14 wherein the second metal segment has a length of less than 10 microns, the pulsed laser energy density is less than 1 Joule/cm$^2$, the voltage potential is less than 1 volt, and the metal segments comprise one of aluminum or copper.

16. The method of claim 14 further comprising a third metal segment, which is electrically isolated from the first metal segment and the second metal segment, whereby the antifuse can be closed to a first circuit connected to the first metal segment by applying a voltage potential between the first metal segment and the second metal segment, or the antifuse can be closed to a second circuit connected to the third metal segment by applying a voltage potential between the third metal segment and the second metal segment.

17. The method of claim 14 wherein the first metal segment forms a portion of the cavity sidewall.

\* \* \* \* \*